United States Patent
Bosshart

(10) Patent No.: US 6,657,484 B1
(45) Date of Patent: Dec. 2, 2003

(54) SYSTEM AND METHOD FOR DECOUPLING CAPACITANCE FOR AN INTEGRATED CIRCUIT CHIP

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 10/159,706

(22) Filed: May 30, 2002

(51) Int. Cl.[7] .................. H03B 1/00; H03K 5/00; H04B 1/00
(52) U.S. Cl. ........................ 327/558; 333/172
(58) Field of Search ................. 327/551, 558; 323/172, 202

(56) References Cited

U.S. PATENT DOCUMENTS

| | | | |
|---|---|---|---|
| 5,796,995 A | 8/1998 | Nasserbakht et al. | 395/558 |
| 5,844,954 A | 12/1998 | Casasanta et al. | 375/373 |
| 6,078,634 A | 6/2000 | Bosshart | 375/376 |
| 6,204,732 B1 | 3/2001 | Rapoport et al. | 331/2 |
| 6,229,861 B1 | 5/2001 | Young | 375/356 |
| 6,275,548 B1 | 8/2001 | Wolf et al. | 375/355 |
| 6,285,172 B1 | 9/2001 | Torbey | 323/237 |
| 6,292,016 B1 | 9/2001 | Jefferson et al. | 326/39 |
| 6,295,315 B1 | 9/2001 | Frisch et al. | 375/226 |
| 6,324,234 B1 | 11/2001 | Kiasaleh | 375/355 |
| 6,327,218 B1 | 12/2001 | Bosshart | 365/233 |
| 6,331,805 B1 | 12/2001 | Gupta et al. | 331/107 S |
| 6,459,331 B1 * | 10/2002 | Takeuchi et al. | 327/554 |
| 2001/0045873 A1 * | 11/2001 | Suzuki et al. | 333/12 |
| 2002/0021112 A1 * | 2/2002 | Mader | 323/266 |
| 2002/0152448 A1 * | 10/2002 | Uematsu et al. | 716/8 |

* cited by examiner

Primary Examiner—Terry D. Cunningham
Assistant Examiner—Quan Tra
(74) Attorney, Agent, or Firm—Alan K. Stewart; W. James Brady, III; Frederick J. Telecky, Jr.

(57) ABSTRACT

A system and method for decoupling capacitance for an integrated chip includes a load coupled between a power supply line and a ground. A distributed resistive-capacitive (RC) filter is coupled between the power supply line and the ground in series with the load. The distributed RC filter is operable to provide decoupled capacitance to the integrated circuit chip.

4 Claims, 3 Drawing Sheets

SYSTEM AND METHOD FOR DECOUPLING CAPACITANCE FOR AN INTEGRATED CIRCUIT CHIP

RELATED PATENT APPLICATIONS

This application is related to U.S. patent application Ser. No. 10/159,584 entitled "System and Method for Distributing a Reference Clock in an Integrated Circuit" filed on May 30, 2002.

TECHNICAL FIELD OF THE INVENTION

The present invention relates generally to the field of integrated circuits, more particularly to a system and method for decoupling capacitance for an integrated circuit chip.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are formed in and on a substrate and are interconnected to form an integrated circuit. Typically, integrated circuits are attached to a lead frame and protectively packaged to form an integrated circuit chip that can be directly connected to a printed circuit board of an electronic device. Through the printed circuit board, the integrated circuit chip is connected to other chips and to external inputs and outputs.

Packaging of an integrated circuit typically introduces inductance that can, in connection with capacitance of the integrated circuit, lead to resonance between the chip and packaging materials. The resonance is typically damped with on-chip resistance connected in series with the capacitance. Such damping, however, provides only a limited solution.

SUMMARY OF THE INVENTION

The present invention provides a system and method for decoupling capacitance for an integrated circuit chip that substantially eliminate or reduce at least some of the problems and disadvantages associated with previous systems and methods.

In accordance with one embodiment of the present invention, a system and method for decoupling capacitance for an integrated circuit chip includes coupling a load between a power supply line and the ground. A distributed resistive-capacitive (RC) filter is coupled between the power supply line and the ground in series with the load. The distributed RC filter is operable to provide decoupled capacitance to the chip.

In accordance with a specific embodiment of the present invention, the distributed RC filter includes a plurality of multi-stage RC filters. In this embodiment, the multi-stage RC filters each include a distributed first stage and a single, second stage. The multi-stage RC filters may be part of a clock distribution system.

Technical advantages of the present invention include providing an improved method and system for decoupling capacitance of an integrated circuit chip. In a particular embodiment, decoupling capacitance is provided with a distributed resistive-capacitive (RC) filter. The distributed RC filter provides resistance as needed and accordingly may be used as a single solution over a broad range of designs.

Additional technical advantages of the present invention include providing an integrated method and system for providing decoupling capacitance on an integrated circuit chip. In a particular embodiment, the decoupled capacitance provided by the distributed RC filter of a clock distribution system. Accordingly, decoupled capacitance is provided without the need of dedicated circuits and/or components.

Other technical advantages of the present invention will be readily apparent to one skilled in the art from the following figures, description and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
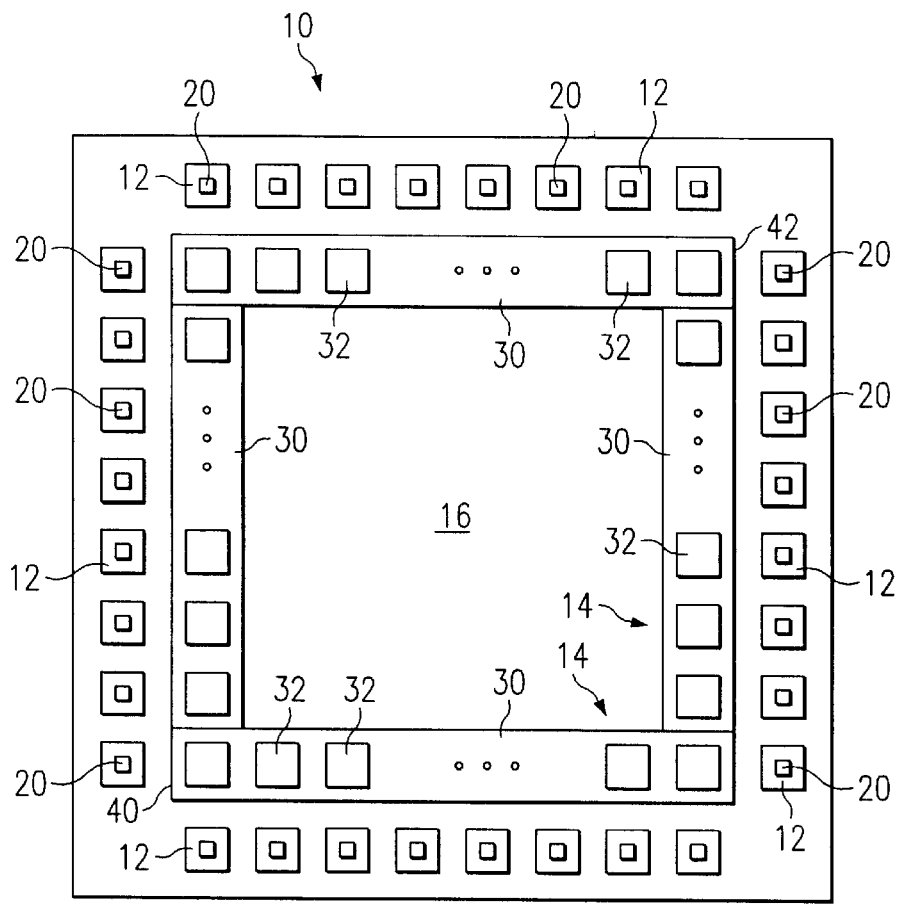
FIG. 1 is a block diagram illustrating an integrated circuit chip in accordance with one embodiment of the present invention.

FIG. 1 illustrates an integrated circuit chip 10 in accordance with one embodiment of the present invention. The integrated circuit chip 10 may be a microprocessor, a memory, a field programmable gata array (FPGA), an application specific integrated circuit (ASIC) and the like. In the ASIC embodiment, for example, the integrated circuit chip 10 may be a switch chip used to receive traffic from ingress links and switch traffic to egress links of a telephony device. Traffic may be internet protocol (IP) packets, asynchronous transfer mode (ATM) cells, other suitable datagrams or signals. It will be understood that the integrated circuit chip 10 may be attached to a lead frame, packaged and connected to a printed circuit board to receive, process and/or store data in any suitable application.

Referring to FIG. 1, for a switch chip and other embodiments, the integrated circuit chip 10 may include a plurality of serial links 12 disposed along the periphery of the chip 10, a clock distribution system 14, and a core area 16. The clock distribution system 14 may be disposed at a periphery of the core area 16 and adjacent to the serial links 12. The serial links 12 may be high-speed serial links transmitting and/or receiving traffic at one gigahertz (GHz), 3 GHz or greater or other suitable rate. The serial links 12 may each include a phase-lock loop (PLL) 20 operable to sample and recover a reference clock time base. As described in more detail below, the PLL 20 may, in one embodiment, attenuate jitter of the clock signal by factor of five.

The clock distribution system 14 is an on-chip system that is fabricated as part of the integrated circuit. The clock distribution system 14 distributes the clock signal to components of the chip 10 that operate based on the clock signal. The reference clock signal may be received from an off-chip source and propagated in several directions on the chip from an ingress point 40 to a termination point 42. In one embodiment, travel distance of the reference clock signal is minimized to the extent possible given design constraints of the core 16 to limit delay of the reference clock in propagation from the ingress point 40 to the termination point 42.

The clock distribution system 14 may include a plurality of clock distribution modules 30 each operable to distribute the reference clock signal to a portion of the chip 10. In one embodiment, as described in more detail below, the clock distribution modules 30 are each a linear section constructed of a plurality of modular clock distribution units 32 serially connected to each other along the module 30. This modular design may allow easy adaptation of the distribution system 14 to various circuit layouts and configurations. The modules 30 may have other suitable configurations and the units 32 may be otherwise suitably connected.

The core 16 may comprise complimentary metal oxide semiconductor (CMOS) and other transistors and solid state components and interconnections to process and/or store data on the chip 10. In the switch chip embodiment, the core 16 may comprise a plurality of CMOS transistors to perform the switching functionality of the chip 10. During operations, the core 16 generates a load on the chip 10.

Figure 2:
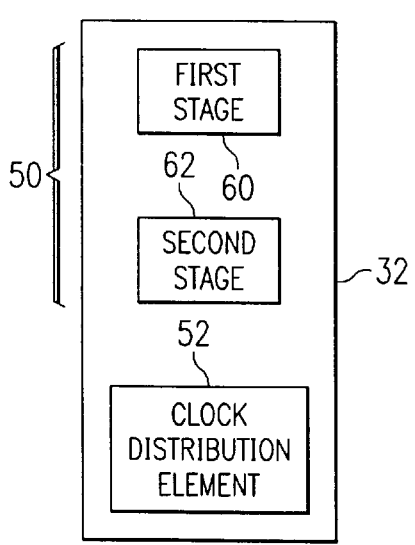
FIG. 2 is a block diagram illustrating details of the clock distribution unit of FIG. 1 in accordance with one embodiment of the present invention.

FIG. 2 illustrates details of the clock distribution units 32 in accordance with one embodiment of the present invention. In this embodiment, the clock distribution system 14 propagates a single reference clock signal for use on the chip 10.

Referring to FIG. 2, the clock distribution unit 32 includes a resistive-capacitive (RC) filter 50 and a clock distribution element 52. The RC filter 50 receives a power signal from a chip power source and filters the power signal to remove and/or attenuate noise in the signal. The RC filter 50 generates a clean power signal for use by the clock distribution element 52. The RC filter 50 may comprise any suitable arrangement of resistors and capacitors as well as other suitable components operable to filter noise from the chip power supply signal.

In one embodiment, the RC filter 50 comprises a multi-stage filter. In this embodiment, the RC filter 50 may be a two stage RC filter including a first stage 60 and a second stage 62. The first stage 60 may be a distributed RC filter. The second stage 62 may be a single stage RC filter. The first and second stage RC filters are described in more detail in connection with FIG. 3.

The clock distribution element 52 propagates, processes and/or utilizes the clock signal. In one embodiment, the clock distribution element 52 may include a reference clock line, a repeater for the clock line, and/or an output buffer of the clock distribution system 14. The clock distribution element 52 may also include and/or have pass through a clean power supply line with power filtered by the RC filter 50 and a clean ground for powering repeaters and output buffers of the clock distribution system 14. Additional details of the clock distribution element 52 are described in more detail in connection with FIG. 4.

Figure 3:
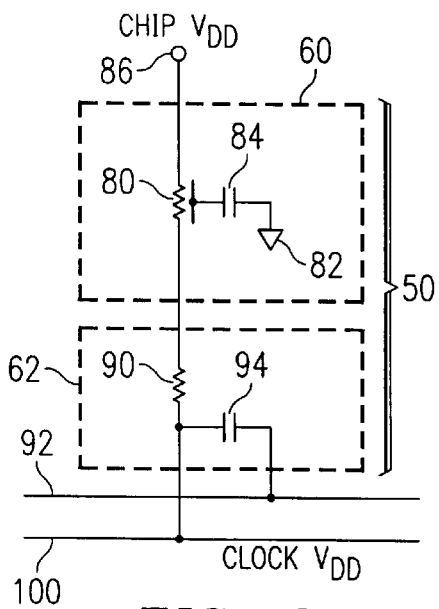
FIG. 3 is a circuit diagram illustrating details of the resistive-capacitive (RC) filter of FIG. 2 in accordance with one embodiment of the present invention.

FIG. 3 illustrates details of the first stage RC filter 60 and of the second stage RC filter 62 in accordance with one embodiment of the present invention. In this embodiment, the first stage RC filter 60 is a distributed RC filter. The second stage RC filter 62 is a single stage RC filter.

Referring to FIG. 3, the distributed RC filter of the first stage 60 includes a resistor 80 capacitively coupled to ground 82 through a set of capacitors 84. These and other elements and components of the RC filter 50, the clock distribution system 14, and the chip 10 may be coupled to each other by direct and/or indirect connections. The first stage filter 60 is coupled to and receives power from a chip power supply line (Chip $V_{DD}$) 86 and provides a first stage RC filtered or cleaned power signal to the second stage filter 62.

The single stage RC filter of the second stage 62 includes a resistor 90 capacitively coupled to a clean ground 92 of the clock distribution system 14 by a capacitor 94. The second stage 62 receives the first stage filtered power signal from the first stage 60 and further filters the signal to generate an RC filtered or clean power signal. The RC filtered power signal is provided to a clean power line (Clock $V_{DD}$) 100 of the clock distribution system 14. The clean ground 92 may be periodically coupled to the chip ground 82.

In a particular embodiment in which the chip 10 is an ASIC switch chip having a CMOS core and three gigabyte per second differential pin serial links 12, reference clock may be 311 megahertz (MHz). In this embodiment, chip power supply may be 1.8 volts. The first stage RC filter 60 may comprise a resistor 80 of 0.25 ohms and a capacitance of 20 nano Farads. In another embodiment, the first stage RC filter 60 may comprise a resistor 80 of 2.5 ohms while the capacitance remains at 20 nano Farads. This may provide increased power supply filtering capability. The second stage 62 may comprise a resistor of 2 ohms and a capacitance of 5 nano Farads. In this embodiment, the RC filter power signal may have a noise level below ±7 millivolts (mV) and the reference clock may have on-chip jitter below ±8 ps peak to peak.

In addition to providing an RC filter power signal, the RC filter 50 provides on-chip distributed RC decoupling capacitance. In particular, the multi-stage RC filters in the clock distribution units 32 of the clock distribution system 14 provide damping of inductance-capacitance (LC) resonance between the packaging and the load of the chip 10. The use of the multiple RC filters 50 provide a single design solution over a broad range of designs. For the exemplary embodiment described above, the distributed RC decoupling of capacitance may damp LC resonance around 66 MHz, typically between 40–100 MHz. In the CMOS, MOS or other suitable embodiments, the gate capacitance of these transistors between gate and the source/drain (between $V_{DD}$ and ground for n-channel and between ground and $V_{DD}$ for p-channel) provides the decoupling capacitance.

Figure 4:
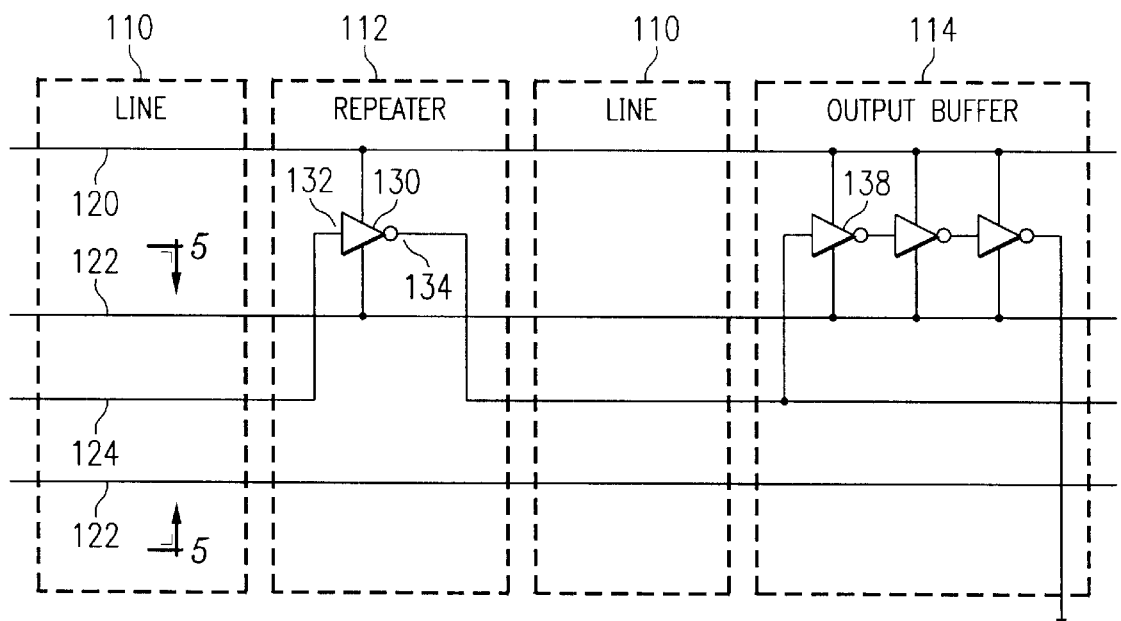
FIG. 4 is a circuit diagram illustrating details of various clock distribution elements of FIG. 2 in accordance with one embodiment of the present invention.

FIG. 4 illustrates a series of clock distribution elements 52 in accordance with one embodiment of the present invention. In the illustrated embodiment, the clock distribution elements 52 include a line element 110, a repeater element 112, an additional line element 110 and an output buffer element 114. The elements may be otherwise arranged and comprise other components without departing from the scope of the present invention.

Referring to FIG. 4, the line element 110 includes a power line 120 providing RC filtered power for components of the clock distribution elements and includes clean grounds 122. The clean grounds 122 border a reference clock line 124 propagating the reference clock signal. Details of the clean grounds 122 and reference clock line 124 are described in more detail in connection with FIG. 5. Power and other lines may be similarly formed.

The repeater element 112 includes the clean power supply line 120 and the clean grounds 122 as well as a repeater 130 coupled to the reference clock line 124. The repeater is coupled to the clean power supply line 120 and the ground lines 120 and 122 and powered by the RC filtered power. The repeater 130 may be an inverter or other suitable element operable to receive and regenerate a reference clock signal.

In operation, the repeater 130 receives the reference clock signal at input 132, regenerates the reference clock signal and outputs the reference clock signal at output 134. To control or minimize resistance in the reference clock line 124, repeater elements 112 may be spaced every 3 millimeters (mm) apart.

The output buffer element 114 includes the clean power supply line 120 and the clean grounds 122 as well as an output buffer 13 coupled to the reference clock line. The output buffer 130 includes a plurality of inverters each coupled to the clean power supply and ground lines 120 and 122 and powered by the RC filtered power. The local output buffers provide a local tap for output of the reference clock signal for use by the high speed serial links 12. The output buffer elements 114 may be spaced at each serial link 12 and as otherwise needed to provide a reference clock output to components of the chip 10.

Figure 5:
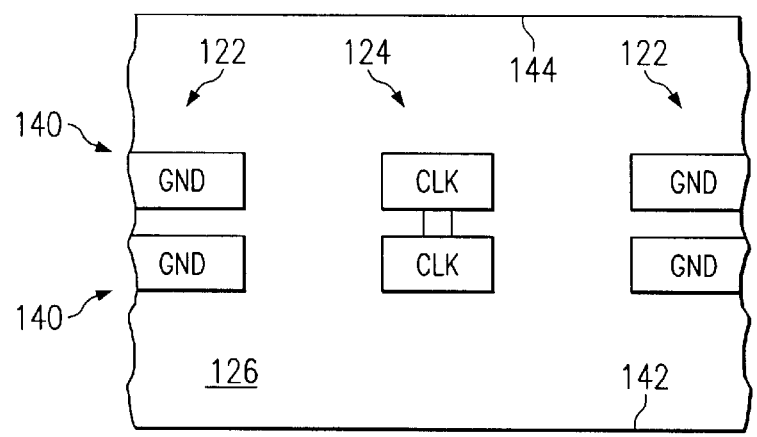
FIG. 5 is a cross-sectional diagram illustrating details of the clock and ground lines of FIG. 4 in accordance with one embodiment of the present invention.

FIG. 5 illustrates details of the clean ground lines 122 and the reference clock line 124 in accordance with one embodiment of the present invention. In this embodiment, the ground and reference clock lines 122 and 124 are each fabricated from two metalization layers 140. The ground and reference clock lines 122 and 124 may comprise any other suitable number of metalization layers 140.

Referring to FIG. 5, the reference clock line 124 is equally spaced from each of the ground lines 122, from an underlying substrate layer 142 and from an overlying layer 144. In a particular embodiment, the space may be two microns ($\mu$m). In this embodiment, the reference clock line 124 may have a width of 2 $\mu$m, a thickness of 0.6 $\mu$m at each metalization layer and be interconnected at a spacing of 2 $\mu$m. The metalization layers may each comprise aluminum, copper or other suitable conductor material. The lines 122 and 124 are isolated by insulator 126 which may be nitride, semiconductor oxide, or any other suitable material operable to electrically isolate the lines 122 and 124.

Figure 6:
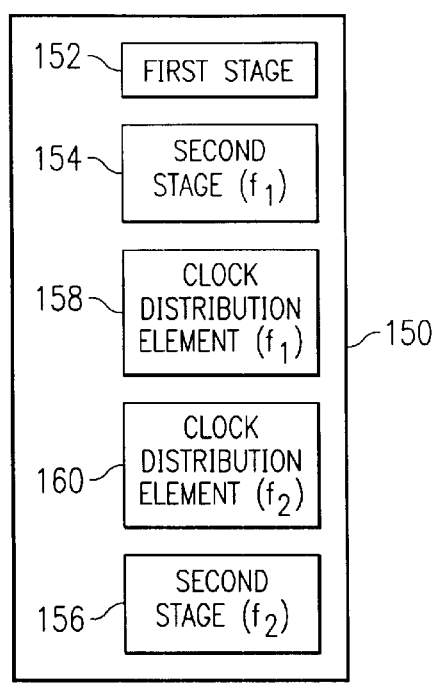
FIG. 6 is a block diagram illustrating details of the clock distribution unit of FIG. 1 in accordance with another embodiment of the present invention.

FIG. 6 illustrates details of the clock distribution unit 32 in accordance with another embodiment of the present invention. In this embodiment, the clock distribution unit 32 is a multi-frequency clock distribution unit 150 operable to propagate two reference clock signals. It will be understood that clock distribution unit 150 may include additional and corresponding clock distribution elements and second stage filters in order to propagate any suitable number of reference clock signals.

Referring to FIG. 6, the clock distribution unit 150 includes a first stage RC filter 152 which may be constructed as previously described in connection with first stage RC filter 60 of clock distribution unit 50. The multi-frequency clock distribution unit 150 includes a first second stage RC filter 154 for a first clock frequency and a second second stage RC filter 156 for a second clock frequency. Each of the first and second second stage RC filters 154 and 156 may comprise a single resistor and capacitor pair as described in connection with second stage RC filter 62 of the single frequency clock distribution unit 50. Details of the connection of the second stage RC filters 154 and 156 to the first stage filter 152 are described in more detail in connection with FIG. 7.

A first clock distribution element 158 propagates, repeats and taps a first reference clock line while a second clock distribution element 160 propagates, repeats and taps a second reference clock line. The clock distribution elements 158 and 160 may each be implemented as described in connection with clock distribution elements 110, 112, 114 and 116 of FIG. 4. In this way, multiple clock signals may be propagated in the clock distribution system 14 and powered by RC filtered power to reduce and/or minimize delay induced jitter on the output signals.

Figure 7:
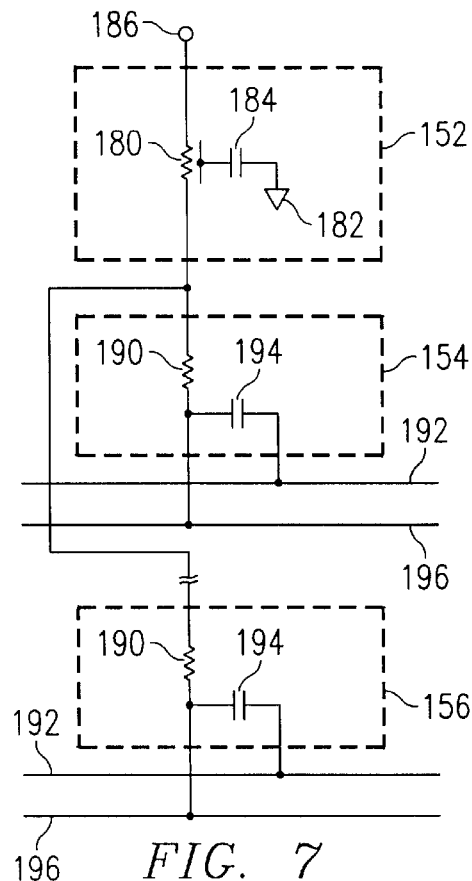
FIG. 7 is a circuit diagram illustrating details of the RC filter of FIG. 6 in accordance with one embodiment of the present invention.

FIG. 7 illustrates details of the first and second stage RC filters 152, 154 and 156 in accordance with one embodiment of the present invention. In this embodiment, the first stage RC filter 152 is a distributed RC filter while each of the second stage RC filters 154 and 156 is a single stage RC filter. As used herein, each means every one of at least a subset of the identified items.

Referring to FIG. 7, the distributed RC filter of the first stage 152 includes a resistor 180 capacitively coupled to ground 182 through a set of capacitors 184. The first stage filter 152 is coupled to and receives power from a chip power supply line (Chip $V_{DD}$) 186 and provides a first stage RC filtered or cleaned power signal to each of the second stage filters 154 and 156.

The second stage filters 154 and 156 each include a resistor 190 capacitively coupled to a clean ground 192 of the clock distribution system 14 by a capacitor 194. The resistors 190 and capacitors 194 of the second stages 154 and 156 are each suitably sized based on the first stage filter 152 and the frequency of the corresponding reference clock. The second stages 154 and 156 each receive the first stage filtered power signal from the first stage 152 and further filters the signals to generate an RC filtered or cleaned power signal. The RC filtered power signal is provided to the corresponding clean power line (Clock $V_{DD}$) 196. The clean grounds 192 may be periodically coupled to each other and to the chip ground 182.

Figure 8:
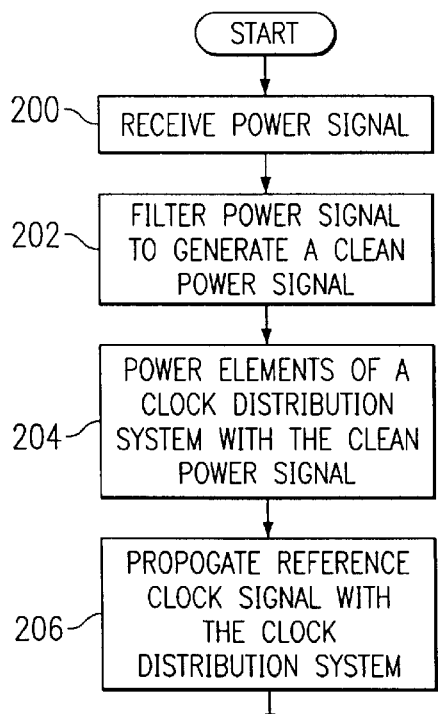
FIG. 8 is a flow diagram illustrating a method for powering a clock distribution system in accordance with one embodiment of the present invention.

FIG. 8 illustrates a method for distributing a reference clock in an integrated circuit in accordance with one embodiment of the present invention. In this embodiment, a single reference clock signal is propagated within the clock distribution system 14. It will be understood that any suitable number of reference clock signals may be similarly propagated.

Referring to FIG. 8, the method begins at step 200 in which a power signal is received from the on-chip power supply. In one embodiment, the signal is received from an on-chip power supply line fed by an on-chip source. At step 202, the chip power supply signal is filtered with an RC filter to generate a clean power supply signal. The filter attenuates noise in the power supply signal generated by operation of core 16 components of the chip 10. In a particular embodiment, the filtered power supply signal may have a noise level below ±7 mv.

Proceeding to step 204, elements of the clock distribution system 14 are powered with the clean power supply signal. The elements include repeaters and inverters of the output buffers. Next, at step 206, the reference clock signal is propagated within the clock distribution system on the reference clock line by elements of the system. Step 206 leads to the end of the process. The clean power signal may allow the propagation delay and jitter of the reference clock signal to be minimized on high speed chip interface signals and high speed double data rate (DDR) interfaces and serial links.

Figure 9:
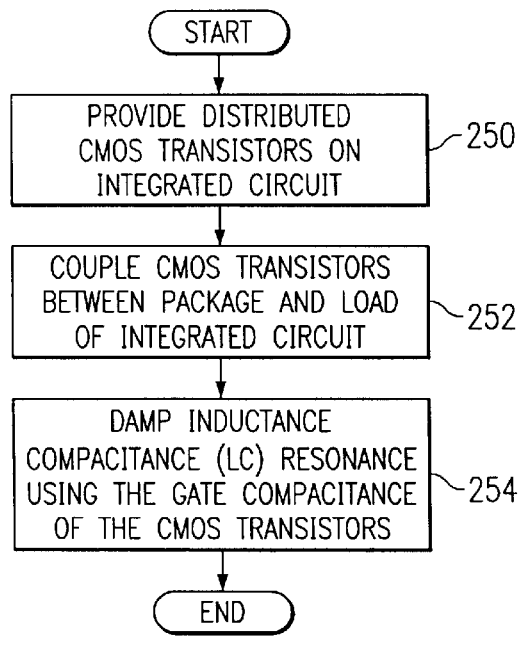
FIG. 9 is a flow diagram illustrating a method for providing decoupling capacitance for an integrated circuit chip in accordance with one embodiment of the present invention.

FIG. 9 illustrates a method for providing decoupling capacitance for integrated circuit chip in accordance with one embodiment of the present invention. In this embodiment, the gate capacitance of CMOS transistors are used. It will be understood that other suitable types of MOS and other transistors may be used without departing from the scope of the present invention.

Referring to FIG. 9, the method begins at step 250 in which distributed CMOS transistors are provided on an integrated circuit. In one embodiment, the distributed CMOS transistors may be distributed in a reference clock propagation system, otherwise suitably distributed on an integrated circuit or otherwise disposed within the integrated circuit.

Proceeding to step 252, the CMOS transistors are coupled between the packaging and the load of the integrated circuit. At step 254, the CMOS transistors damp LC resonance using the gate capacitance of the CMOS transistors. Use of the gate capacitance of distributed CMOS or other suitable transistors may provide a single design solution over a broad range of integrated circuit designs.

Although the present invention has been described with several embodiments, several changes and modifications may be suggested to one skilled in the art. It is intended that the present invention encompass such changes and modifications as fall within the full scope of the appended claims.

What is claimed is:

1. An integrated circuit chip, comprising:
   a load coupled between a power supply line and a ground;
   a distributed resistive-capacitive (RC) filter coupled between the power supply line and the ground in series with the load, the distributed RC filter operable to provide decoupled capacitance to the chips;
   the distributed RC filter comprising a plurality of multi-stage RC filters; and
   the multi-stage RC filters each comprise a distributed first stage and a non-distributive second stage.

2. A method for decoupling capacitance for an integrated circuit chip, comprising:
   filtering a power supply with a distributed resistive-capacitive (RC) filter to provide a clean power signal for distributing a reference clock signal;
   damping inductive-capacitive (LC) resonance of the chip with the distributive RC filter of the clock distribution system;
   the distributed RC filter comprises a plurality of multi-stage RC filters; and
   the multi-stage RC filters each comprise a distributed first stage and a non-distributed second stage.

3. The method of claim 2, wherein the integrated circuit chip comprises a complimentary metal oxide semiconductor (CMOS) integrated circuit.

4. An application specific integrated circuit (ASIC) switch chip, comprising:
   a complementary metal oxide semiconductor (CMOS) integrated circuit forming a load during operation of the chip;
   a clock distribution system powered by resistive-capacitive (RC) filtered power;
   the clock distribution system operable to damp inductive-capacitive (LC) resonance of the chip;
   a distributed RC filter operable to provide the RC filtered power and to damp the LC resonance of the chip;
   the distributed RC filter comprises a plurality of multi-stage RC filters; and
   the multi-stage RC filters each comprise a distributed first stage and a non-distributed second stage.

* * * * *